(12) United States Patent
Rosano et al.

(10) Patent No.: US 6,571,806 B2
(45) Date of Patent: *Jun. 3, 2003

(54) METHOD FOR DRYING A SUBSTRATE

(75) Inventors: Michael Rosano, San Jose, CA (US); Muhammad Asif, San Jose, CA (US); Robert Pui Chi Fung, San Mateo, CA (US)

(73) Assignee: Komag, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/837,536

(22) Filed: Apr. 17, 2001

(65) Prior Publication Data

US 2002/0083967 A1 Jul. 4, 2002

Related U.S. Application Data

(63) Continuation-in-part of application No. 09/186,048, filed on Nov. 3, 1998, now Pat. No. 6,216,709.
(60) Provisional application No. 60/099,159, filed on Sep. 4, 1998.

(51) Int. Cl.[7] .............................. B08B 3/04; C03C 23/00

(52) U.S. Cl. ............................ 134/25.4; 134/2; 134/32; 134/26; 134/61; 134/66; 134/95.2; 134/135; 134/902

(58) Field of Search ........................ 134/21, 25.4, 26, 134/32, 95.2, 902, 61, 66, 135

(56) References Cited

U.S. PATENT DOCUMENTS

| | | | |
|---|---|---|---|
| 4,722,752 A | 2/1988 | Steck | 134/25.4 |
| 4,778,532 A | 10/1988 | McConnell et al. | 134/10 |
| 4,911,761 A | 3/1990 | McConnell et al. | 134/11 |
| 4,917,123 A | 4/1990 | McConnell et al. | 134/95 |
| 4,984,597 A | 1/1991 | McConnell et al. | 134/95 |
| 5,421,905 A | 6/1995 | Ueno et al. | 134/25.1 |
| 5,569,330 A | 10/1996 | Schild et al. | 134/1 |
| 5,571,337 A | 11/1996 | Mohindra et al. | 134/25.4 |
| 5,884,640 A | 3/1999 | Fishkin et al. | 134/95.2 |
| 5,902,402 A | 5/1999 | Durst et al. | 118/423 |

FOREIGN PATENT DOCUMENTS

| | | | |
|---|---|---|---|
| EP | 0 385 536 A1 | | 9/1990 |
| JP | 10-308377 | * | 11/1998 |
| JP | 10-308378 | * | 11/1998 |
| WO | WO 96/21241 | | 7/1996 |
| WO | WO 96/36068 | | 11/1996 |

* cited by examiner

Primary Examiner—Zeinab El-Arini

(57) ABSTRACT

A method for drying a disk-shaped substrate. The substrate is typically a substrate used for the manufacture of magnetic disks, and has a centrally located opening. The substrate is lowered into a liquid bath by a first holder, which also becomes immersed in the bath. The first holder lifts the substrate until the substrate extends partially out of contact with the liquid. A second, dry holder grabs a dry portion of the substrate that extends out of the bath, and continues to lift the substrate out of contact with the liquid. In one embodiment, different portions of the substrate are lifted past the surface of the liquid at different speeds

13 Claims, 10 Drawing Sheets

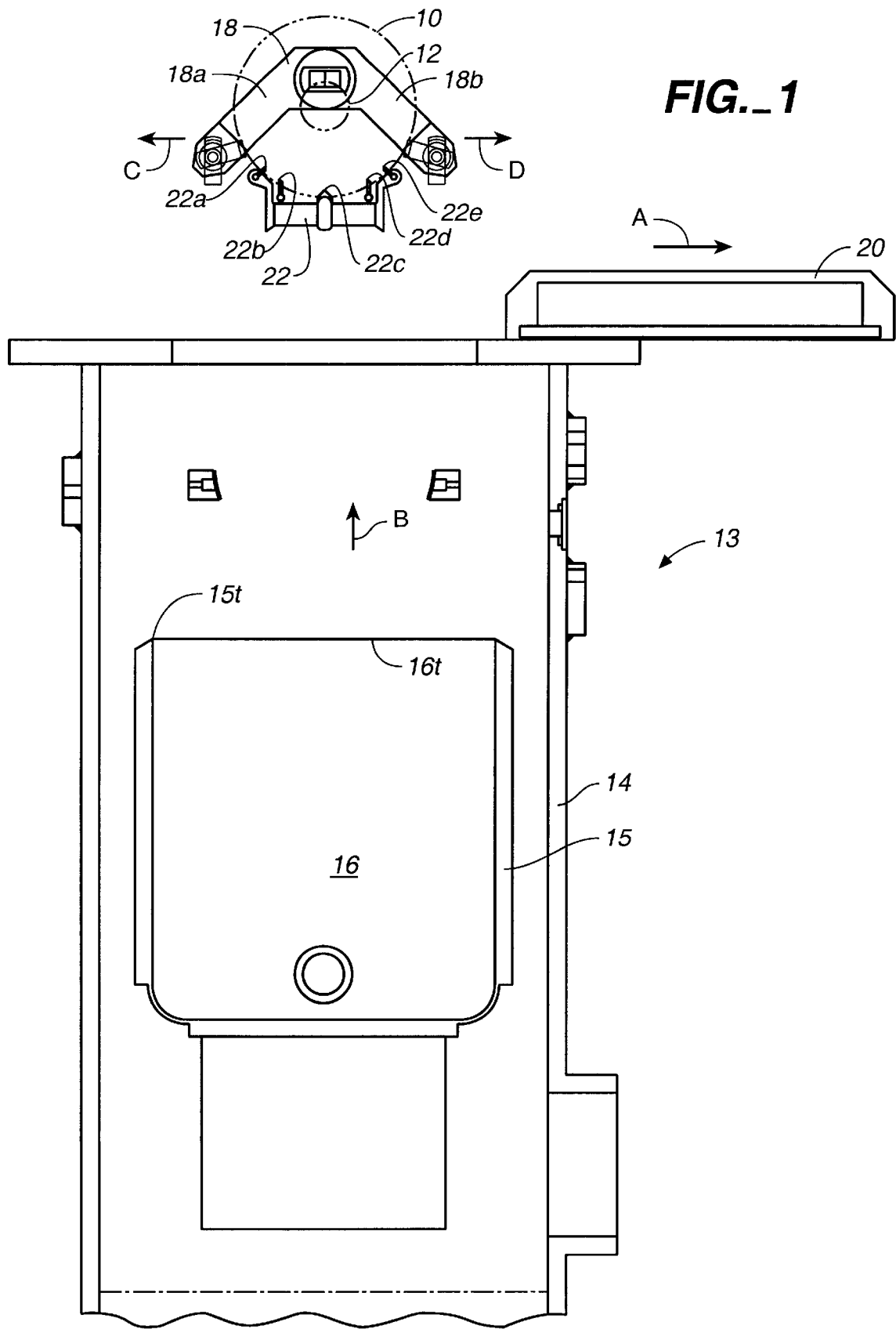
FIG._1

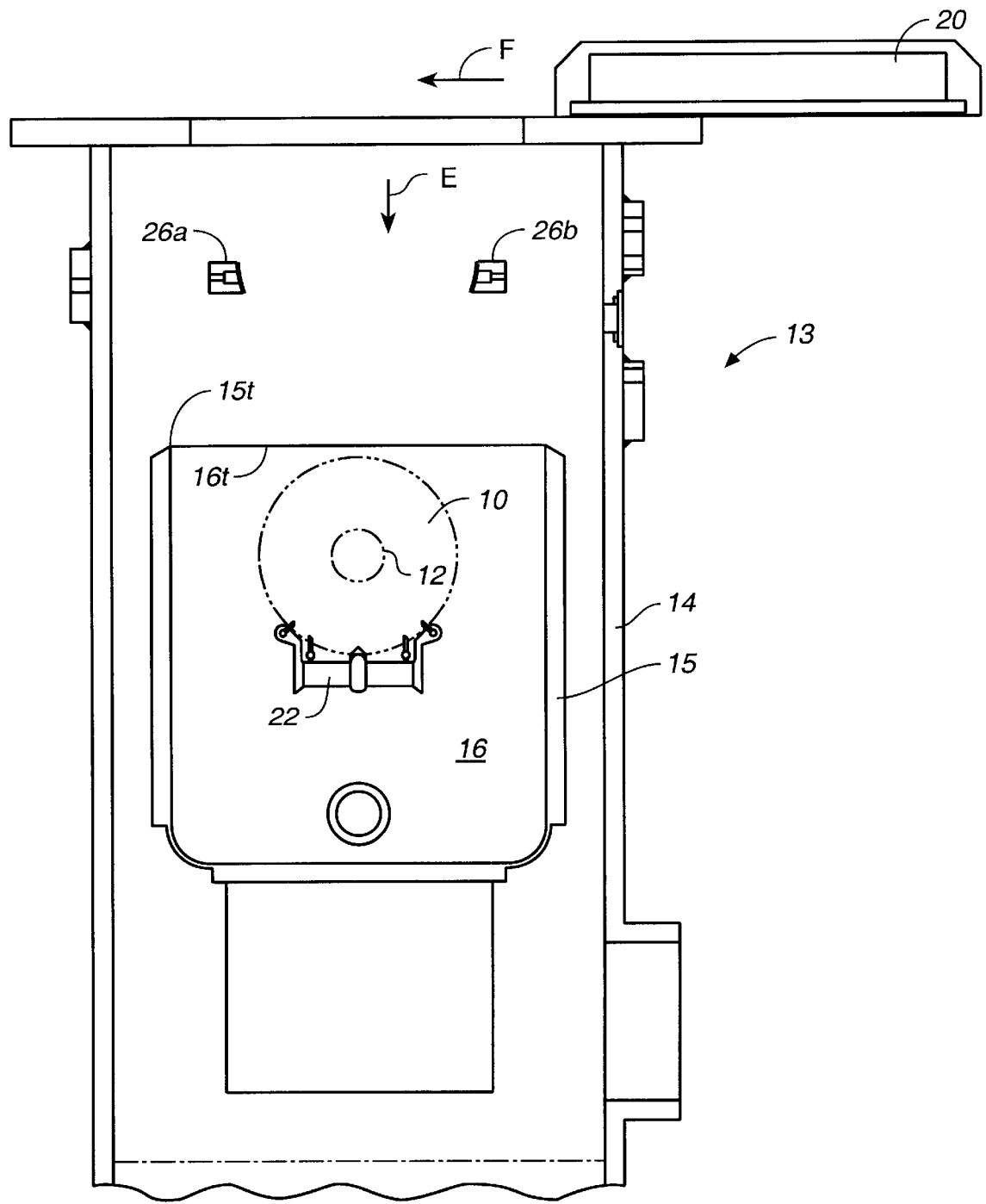
FIG._2

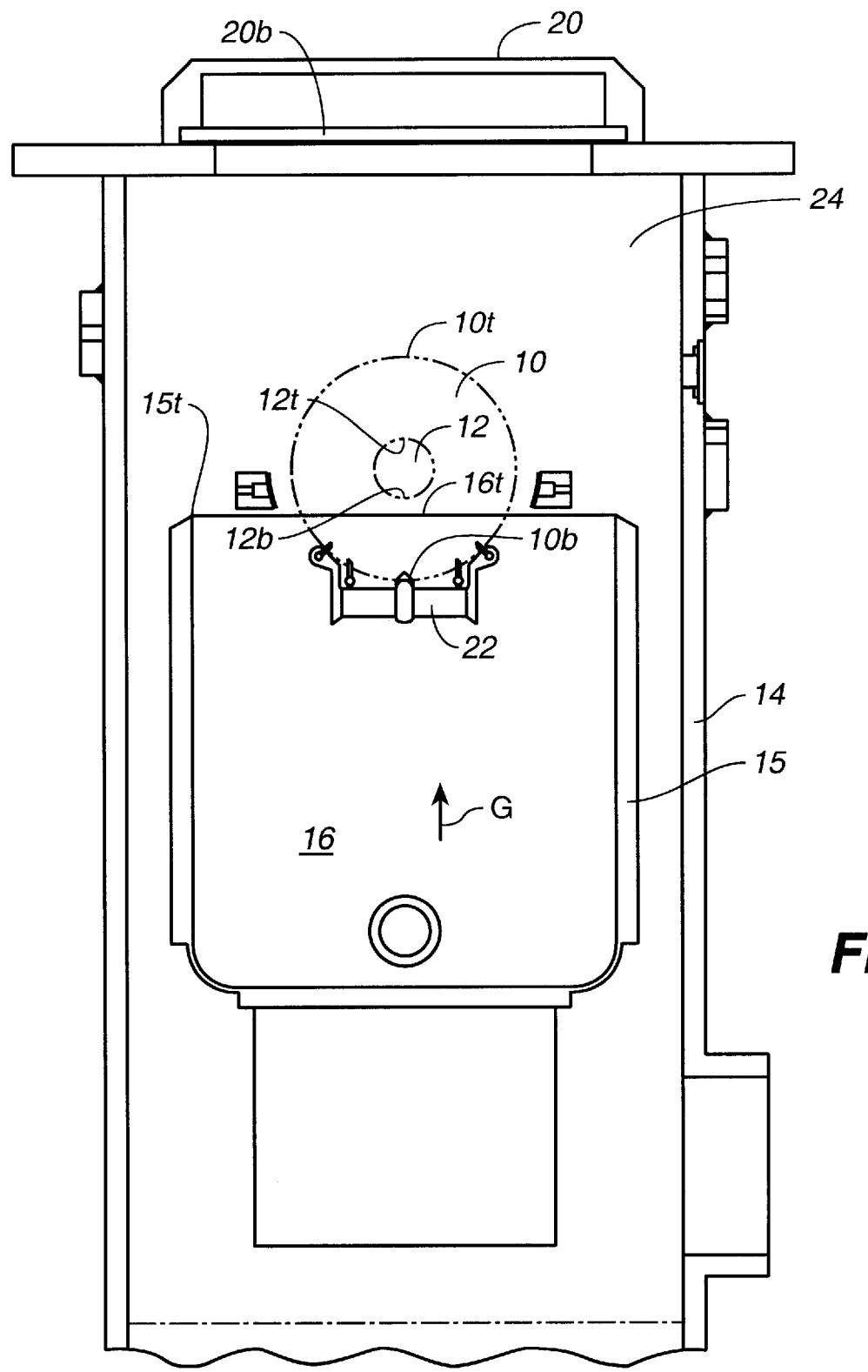
FIG._3

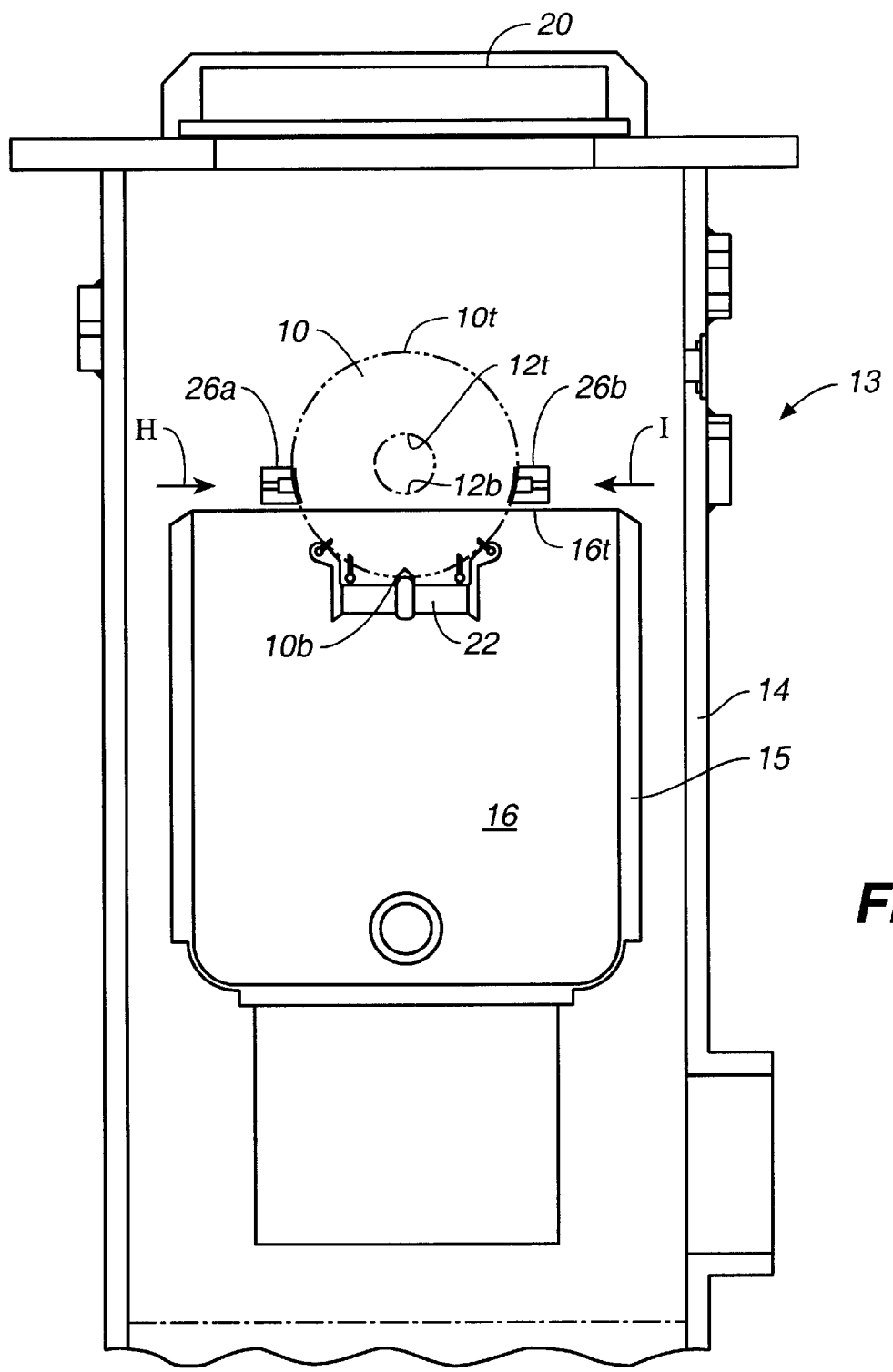
FIG._4

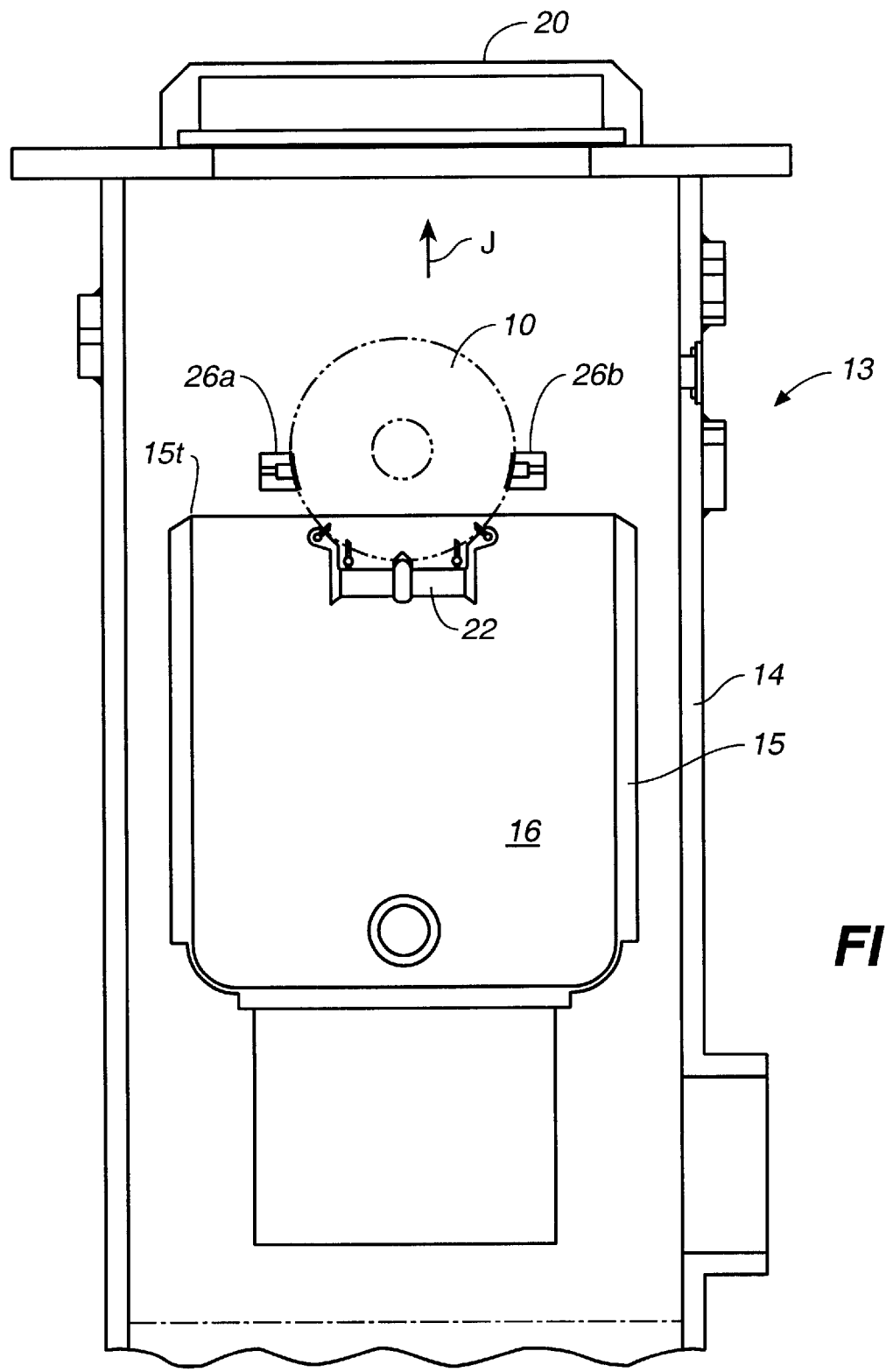
FIG._5

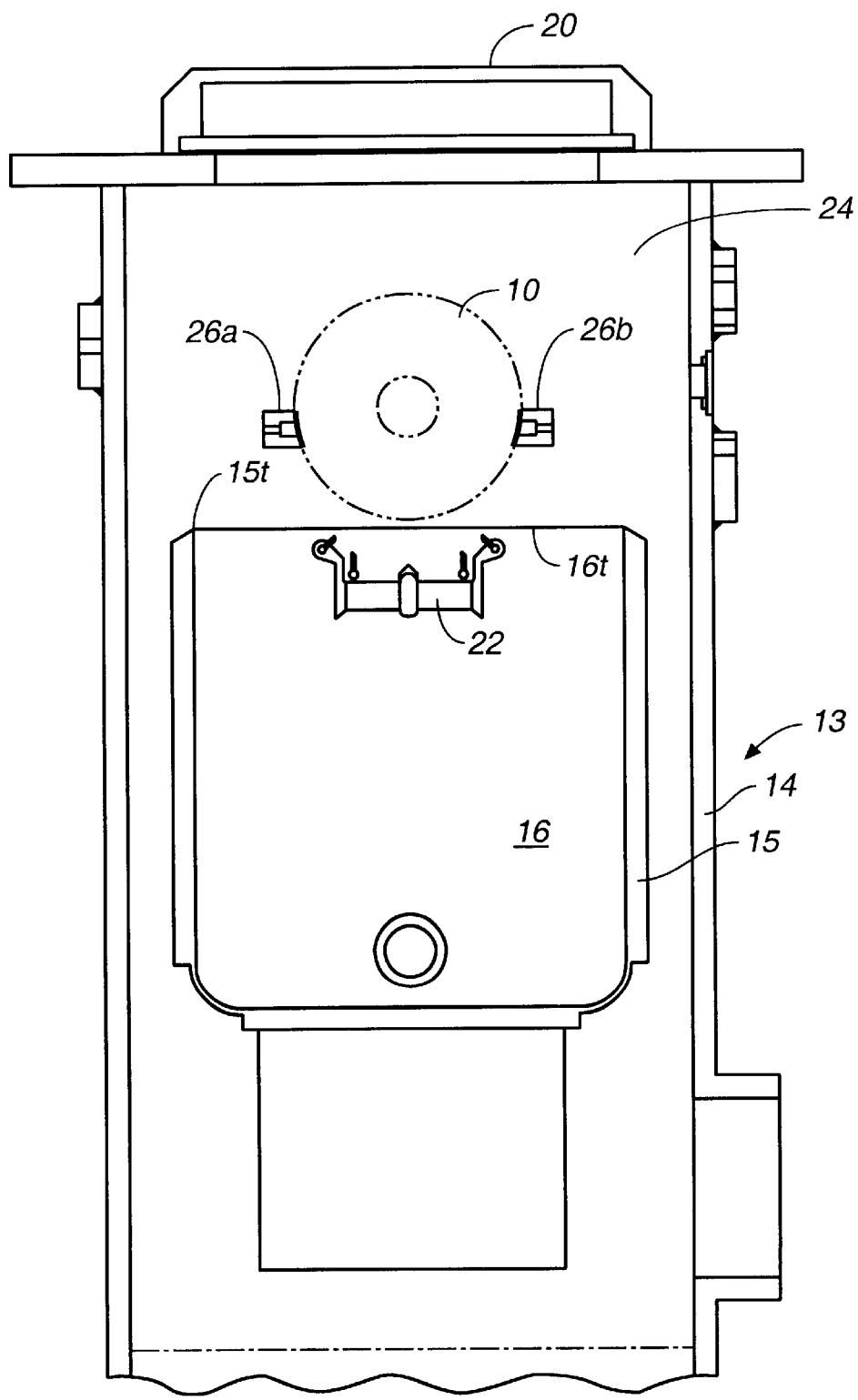
FIG._6

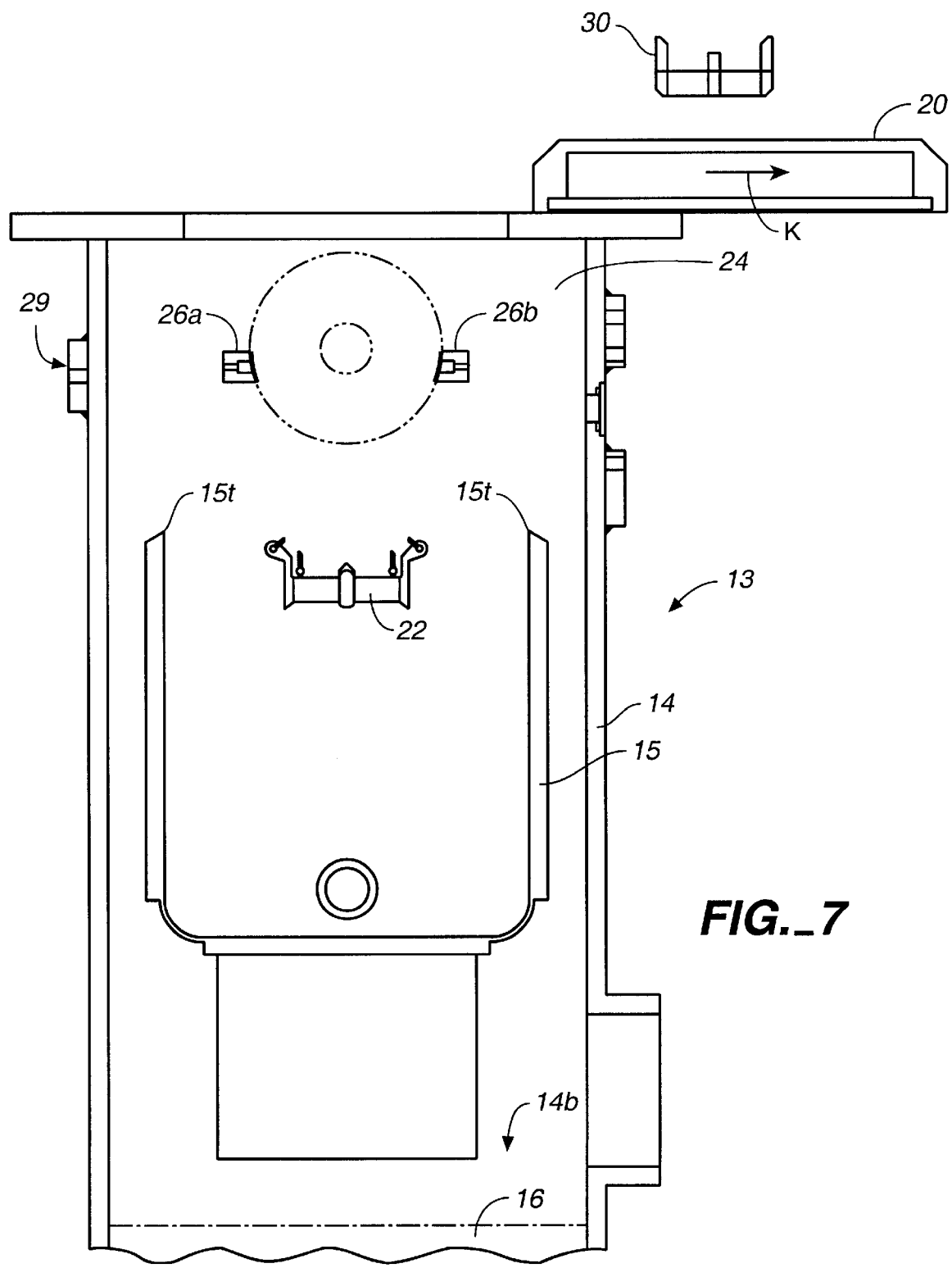
FIG._7

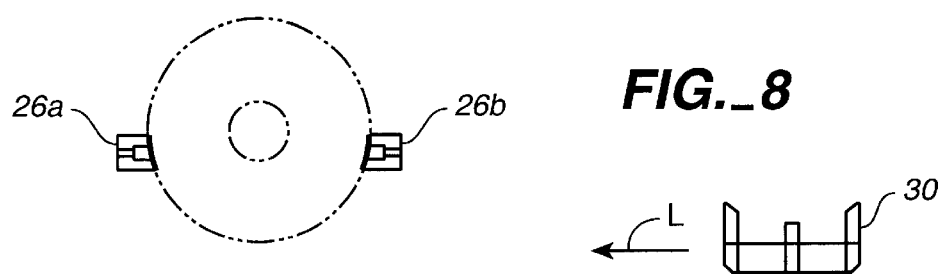
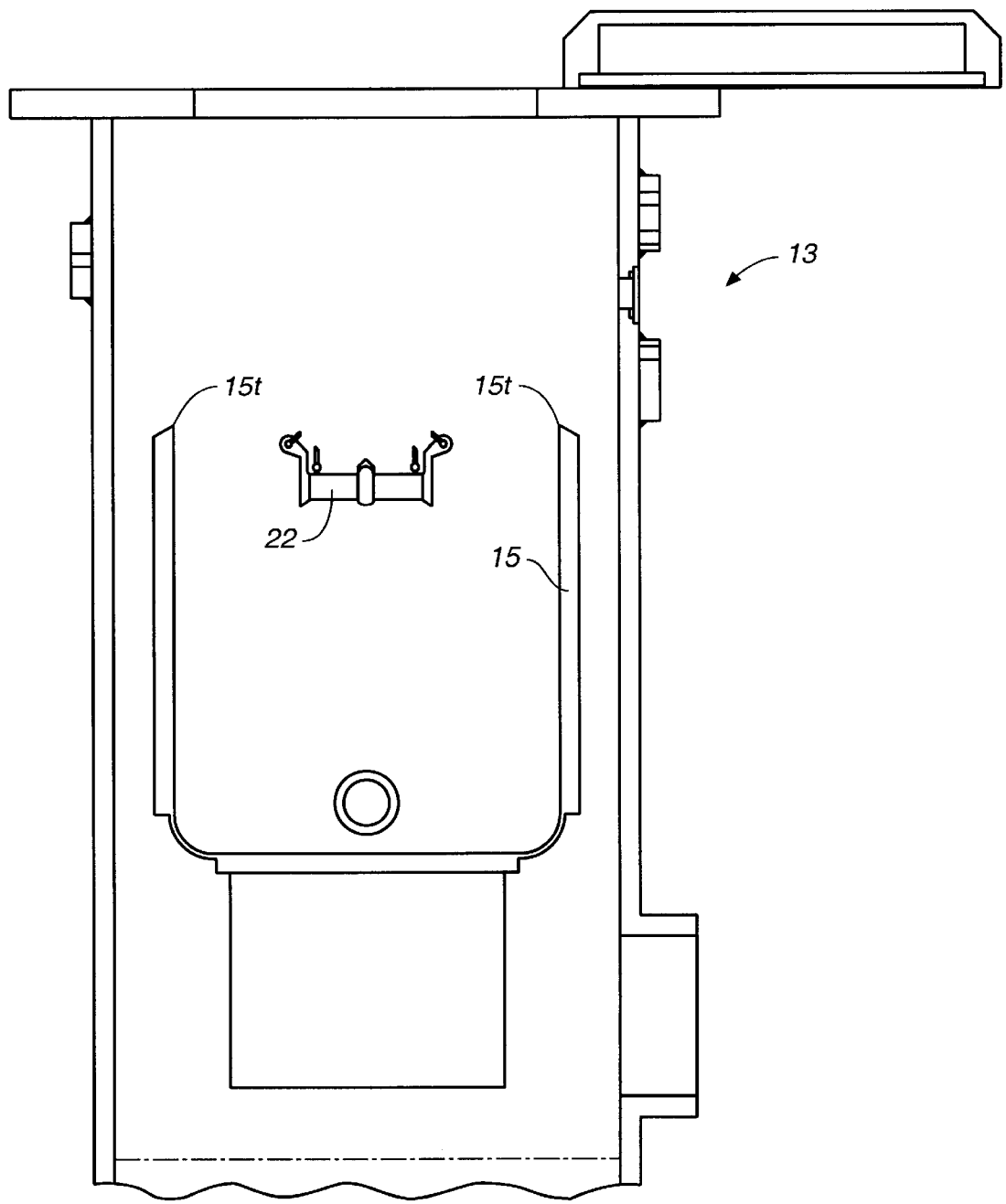
FIG._8

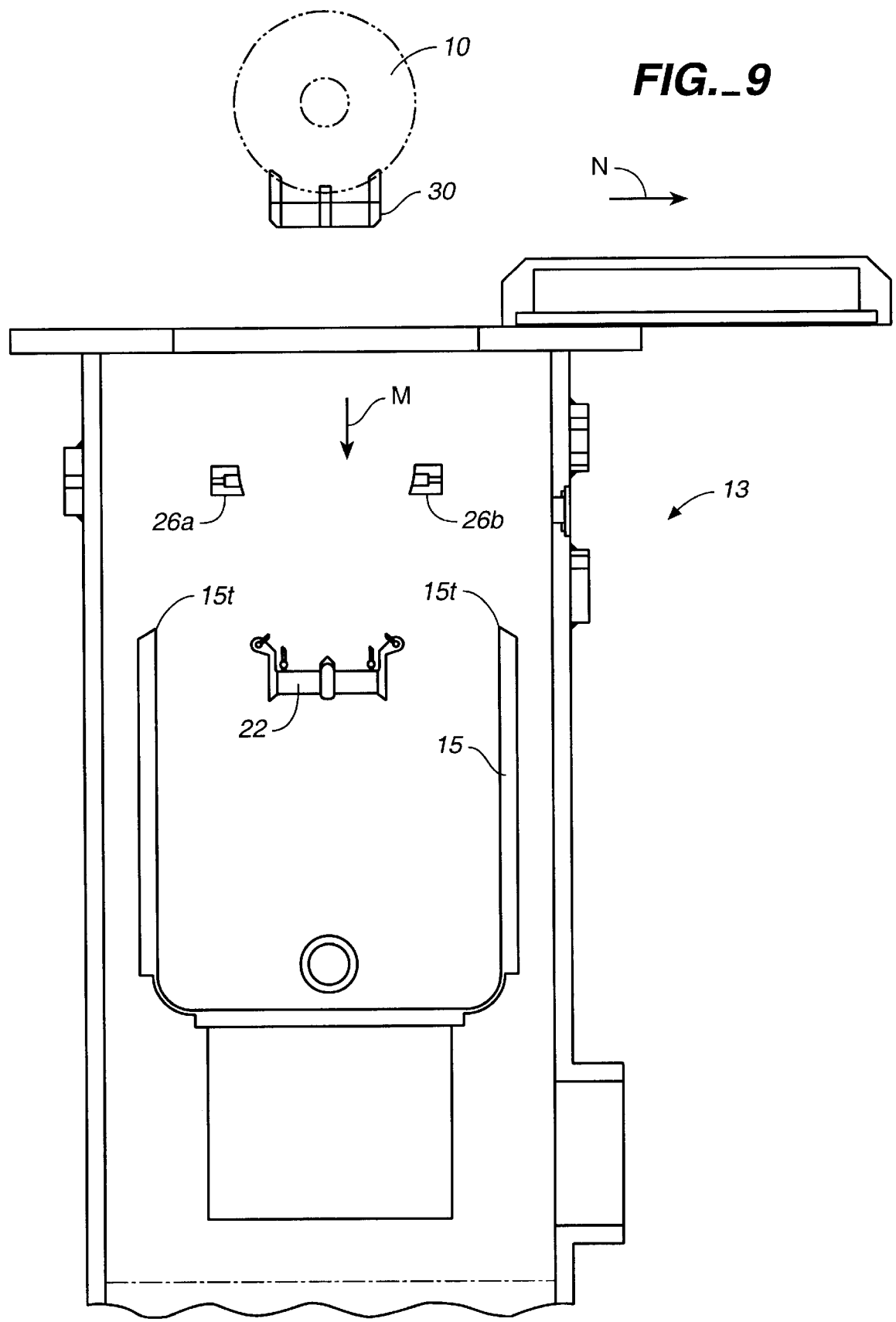
FIG._9

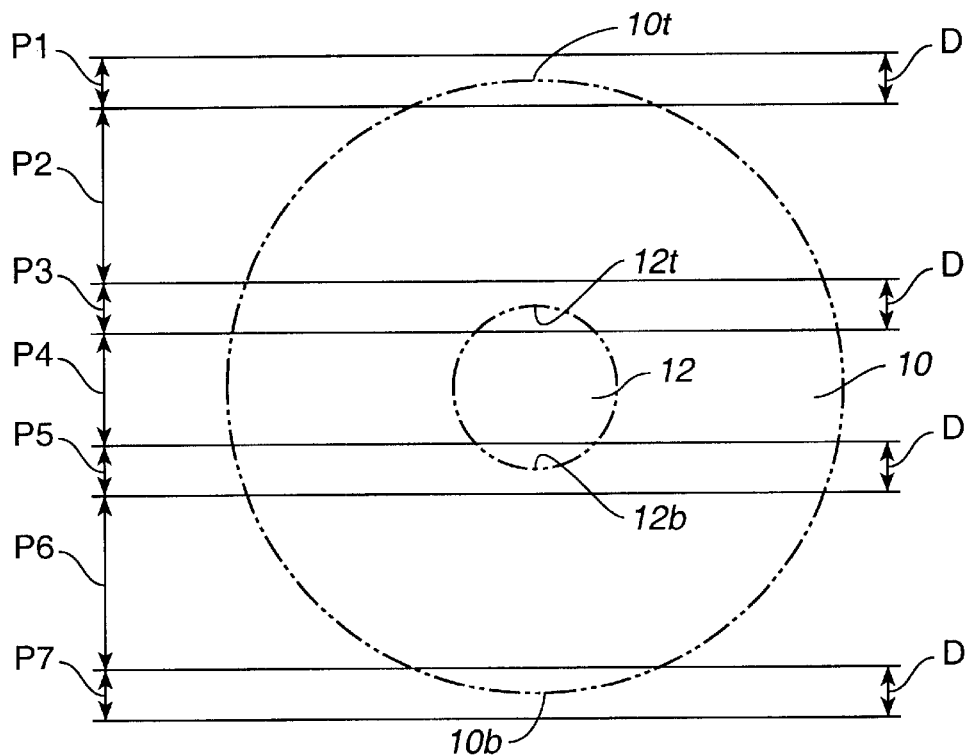
FIG._10
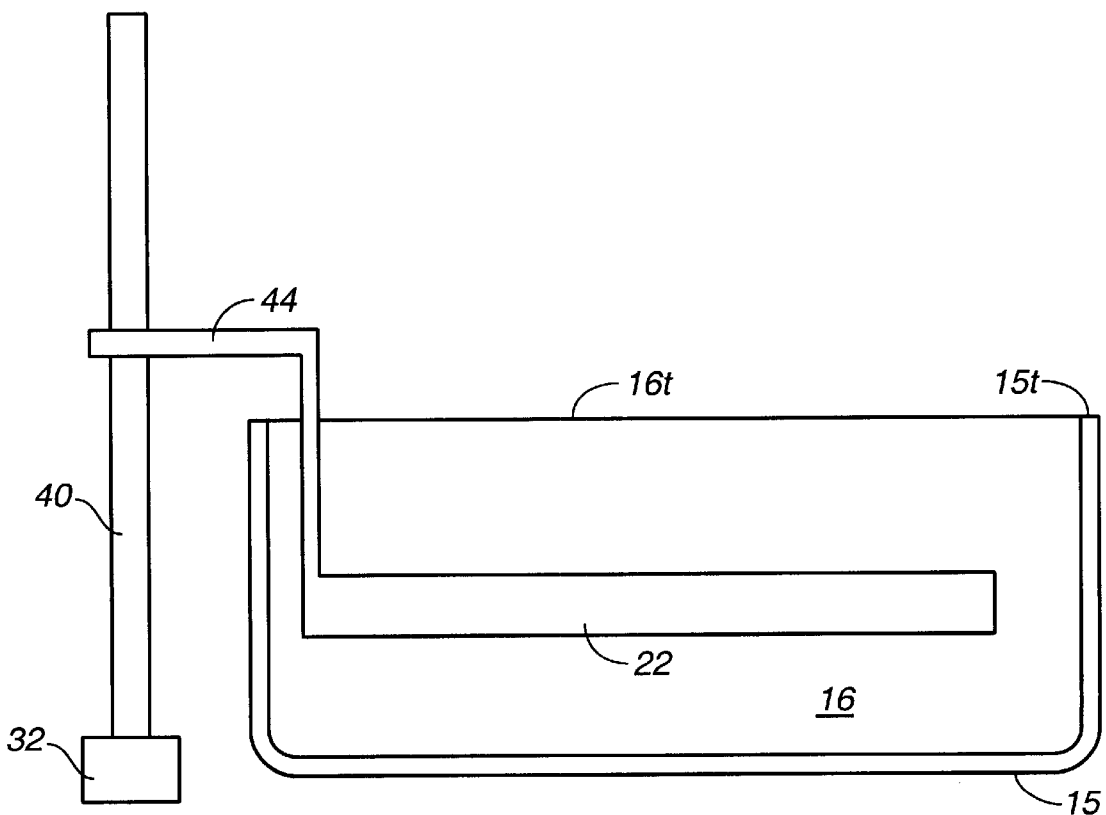
FIG._11

METHOD FOR DRYING A SUBSTRATE

This application is a continuation-in-part of U.S. patent application Ser. No. 09/186,048 filed Nov. 3, 1998, now U.S. Pat. No. 6,216,709, which claims priority based on provisional application 60/099,159, filed Sep. 4, 1998.

BACKGROUND OF THE INVENTION

This invention relates to a method and apparatus for drying a workpiece such as a substrate used in magnetic disk or integrated circuit manufacturing.

In many manufacturing processes it is necessary to treat a workpiece with a liquid and then dry the workpiece. For example, during the manufacturing of magnetic disks, one typically performs the following manufacturing steps:

1. First, a nickel-phosphorus layer is plated onto an aluminum substrate;
2. The nickel-phosphorus layer is polished and textured;
3. The substrate is cleaned, rinsed and dried;
4. A series of layers are sputtered onto the substrate, e.g. an underlayer such as sputtered NiP or Cr, a magnetic cobalt alloy, and a protective hydrogenated carbon overcoat. An example of such a process is described in U.S. Pat. No. 6,150,015, issued to Bertero et al. and incorporated herein by reference.

Immediately prior to sputtering, the substrate is cleaned and then dried. It is very important that when the substrate is dried, there should be no impurities left on its surface.

Numerous other manufacturing processes require drying a workpiece. For example, during various semiconductor manufacturing process steps, semiconductor wafers are immersed in a liquid and then dried. It is very important that there be no impurities on the surface of these wafers after drying.

One apparatus for drying semiconductor wafers is discussed in European Patent Application 0 385 536. In the '536 apparatus, a wafer is immersed in a liquid and then slowly removed from the liquid in the presence of a vapor that aids in the drying process. The cooperation of this vapor and liquid creates the so-called Marangoni effect, which facilitates drying of the wafer. In the '536 apparatus, a "knife-shaped member" pushes the wafer out of a liquid and into a region where the wafer can be dried.

Another apparatus for drying semiconductor wafers is discussed in U.S. Pat. No. 5,569,330, issued to Schild et al. Schild also teaches a structure that pushes a wafer out of a liquid into a region where the wafer can dry.

During some prior art drying processes, a wafer is held by a holding structure while it is drying. This leaves the possibility of some contamination or drying marks at the point where the drying wafer is held by the holding structure. One apparatus for dealing with this problem is discussed in U.S. Pat. No. 5,884,640, issued to Fishkin et al. In Fishkin's drying apparatus, instead of pushing a wafer out of a liquid-containing bath, the liquid is drained from the bath. As the liquid level falls with respect to the wafer, the wafer is held at different points so that portions of the wafer are not in mechanical contact with a holding structure while those portions are drying.

U.S. Pat. No. 4,722,752, issued to Steck, discusses another apparatus for drying wafers. Steck's apparatus contains two support structures capable of lifting wafers out of contact with a liquid. A first structure (comprising bars 34 in Steck FIG. 5) lifts Steck's wafers 24 partially out of contact with a liquid. During this time period, a cassette 25 is immersed in the liquid. Steck then pushes cassette 25 out of his liquid. Eventually, cassette 25 dries and thereafter comes into contact with a dry portion of wafers 24. Steck must allow enough time between the time cassette 25 leaves contact with the liquid and the time cassette 25 contacts wafers 24 so that cassette 25 can dry. This potentially limits the throughput of Steck's device.

SUMMARY

A method for drying a workpiece in accordance with the present invention comprises lifting the workpiece out of a liquid bath with a first holding structure until a first portion of the workpiece extends out of the liquid. (At this point in the process, a second portion of the workpiece remains within the liquid.) During this part of the method, the first holding structure is immersed in the liquid, and the portion of the workpiece where the first holding structure contacts the workpiece is immersed in the liquid. The portion of the workpiece extending out of the liquid dries. A second holding structure grabs the dry portion of the workpiece extending out of the liquid, and thereafter lifts the workpiece out of contact with the first holding structure and out of contact with the liquid. (The portion of the second holding structure that lifts the workpiece is dry, and typically, this portion of the second holding structure is never immersed within the liquid. In one embodiment, no portion of the second holding structure is immersed within the liquid.) The second portion of the workpiece then dries. In one embodiment, at no time is a drying portion of the workpiece in contact with a holding structure. Thus, the chance of creating drying marks or contamination on the workpiece is minimized.

Another advantage of a method in accordance with the invention is that because the second holding structure is never immersed in the liquid, there is no need to wait until the second holding structure dries before it can grab the workpiece. Thus, a method in accordance with the invention is expected to be more efficient than the above-described Steck method.

In one embodiment, the workpiece is a substrate used to manufacture a magnetic disk. The workpiece can be a nickel-phosphorus plated aluminum alloy, glass, glass ceramic, or other material. After drying, various layers such as an underlayer, a magnetic layer, and a protective layer are deposited (e.g. by sputtering, CVD, PECVD, or other technique) onto the workpiece. However, the workpiece can be another type of structure as well, e.g. a semiconductor wafer.

In one embodiment, several (or many) workpieces are dried simultaneously.

In one embodiment, the workpiece is raised at a first speed during the time that the top of the workpiece breaks the surface of the liquid. The workpiece is raised at a second speed after the top of the workpiece has broken the surface of the liquid. The first speed is slower than the second speed. Also, in one embodiment, the workpiece is raised at a third speed during the time when the bottom of the workpiece breaks the surface of the liquid. The third speed is slower than the second speed. The reason for this is that different portions of the workpiece dry at different rates. By adjusting the speed with which the workpiece is raised to accommodate the drying rate of the different portions of the substrate, the overall speed with which the workpiece is dried is improved.

The workpiece can be a substrate having a centrally defined opening. In such an embodiment, the workpiece is raised at a fourth speed during the time the top of the centrally defined opening breaks the liquid surface and the time the bottom of the centrally defined opening breaks the liquid surface. The fourth speed is typically slower than the second speed for reasons stated above. The substrate is raised at a fifth speed after the top of the centrally defined opening breaks the liquid surface but before the bottom of the centrally defined opening breaks the liquid surface. The fifth speed is typically greater than the fourth speed. Optionally, the fifth and second speeds can be equal. The first, third and fourth speeds can also be equal. As mentioned above, the speed with which the substrate is raised is modified to account for the fact that the substrate dries more slowly during the time that the top and bottom of the substrate and the top and bottom of the centrally defined opening break the surface of the liquid.

In one embodiment, a gas or vapor is provided above the top surface of the liquid to facilitate drying. In one embodiment, this vapor comprises IPA (isopropyl alcohol), but other materials can be used, e.g. acetone. Thus, an embodiment of the invention can employ the above-mentioned Marangoni effect.

BRIEF DESCRIPTION OF THE DRAWINGS

FIGS. 1 to 9 illustrate apparatus in accordance with the present invention drying a substrate.

FIG. 10 illustrates a substrate in plan view.

FIG. 11 illustrates apparatus in accordance with one embodiment of the invention in a cross section plane that is perpendicular to the plane of FIGS. 1 to 9.

DETAILED DESCRIPTION

A method in accordance with one embodiment if the invention is used to dry a workpiece, e.g. a disk-shaped workpiece such as substrate 10 shown in FIG. 1. Substrate 10 can be a substrate used to manufacture a magnetic disk. In one embodiment, substrate 10 can be an aluminum alloy plated with a nickel-phosphorus alloy. Alternatively, substrate 10 can be formed from another material, e.g. glass or glass-ceramic. Substrate 10 typically has a centrally defined opening 12. As is known in the art, at the conclusion of manufacturing, the disk is mounted on a spindle (not shown), and opening 12 is the location where the disk is attached to this spindle.

During the manufacturing process, it is desirable to bring substrate 10 into contact with a liquid (e.g. to clean or rinse substrate 10) and then to dry substrate 10. Accordingly, after substrate 10 has been immersed in a first tank containing a liquid (not shown), it is moved to a drying apparatus 13 where it can be dried in such a way as to minimize the likelihood of surface contamination. Apparatus 13 comprises a container 14 containing a tank 15 holding a liquid such as water 16 (FIG. 1). (Water 16 can be deionized water, and can be at a temperature between room temperature and about 60° C. However, other liquids and other temperatures can be used.) As mentioned above, during such a process, it is desirable to dry substrate 10 in a manner that prevents or minimizes drying marks or other contaminant deposits on substrate 10. A method in accordance with the invention promotes that goal.

Referring to FIG. 1, a shuttle 18 carries substrate 10 to a position such that substrate 10 is over tank 15. As soon as substrate 10 is located over tank 15, a cover 20 is retracted in the direction of arrow A. A first holder 22 is moved upwardly (arrow B) so that holder 22 is in position to hold substrate 10. (In one embodiment, holder 22 moves upwardly at a speed between 1.0 to 20 mm/second.) Arms 18a, 18b of shuttle 18 move outwardly (arrows C, D) to thereby let go of substrate 10. At this point in the process, substrate 10 is held by first holder 22. (Appropriate delays may be inserted into the robotic manipulation process to ensure that holder 22 is in position before shuttle 18 releases substrate 10.)

In one embodiment, first holder 22 holds substrate 10 at five contact points 22a–22e. However, in other embodiments, different numbers of contact points can be used.

First holder 22 then lowers substrate 10 (direction E) into tank 15, thereby immersing substrate 10 in water 16 (see FIG. 2). This lowering can be at a relatively high speed (again, between 1.0 and 20 mm/seconds). Substrate 10 can remain immersed in water 16 for about 10 to 300 seconds. Optionally, during this portion of the process, water 16 can be mechanically agitated to promote a cleaning process. This agitation can be ultrasonic or megasonic. (Megasonic agitation is a very high frequency agitation.) Cover 20 is moved in a direction F to close the compartment 24 in which tank 15 is located.

Thereafter, first holder 22 begins to raise substrate 10 at a first relatively high velocity (see arrow G in FIG. 3). This first velocity is about 1 to 20 mm/seconds. Shortly before the top surface 10t of substrate 10 breaks the surface 16t of water 16, the velocity of holder 22 slows to a second, slower velocity, e.g. between about 0.2 to 1.0 mm/second. This continues until after the top 10t of substrate 10 passes the top surface 16t of water 16 (FIG. 3). Starting before the raising of substrate 10 and continuing throughout the raising of substrate 10, a vapor comprising IPA is introduced into compartment 24 to facilitate the drying of substrate 10, and to promote the above-described Marangoni effect. In one embodiment, IPA is provided by bubbling nitrogen through isopropyl alcohol to form an IPA vapor. This vapor is introduced through "showerhead openings" or holes (not shown) in the bottom surface 20b of cover 20.

After top 10t of substrate 10 passes surface 16t of water 16, the rate at which holder 22 raises substrate 10 is increased to a relatively fast velocity, e.g. between about 1.0 and 20 mm/second. Holder 22 continues to raise substrate 10 at this increased rate until the top 12t of opening 12 is about to pass top surface 16t of water 16. At this time, the rate at which holder 22 raises substrate 10 drops again, e.g. to about 0.2 to 1.0 mm/second. After top 12t of opening 12 passes top 16t of water 16, again, the lifting speed of holder 22 increases to the faster velocity, e.g. between 1.0 and 20 mm/second. This change in the speed at which substrate 10 is raised has the following advantage. The drying rate of portion P2, P4 and P6 of substrate 10 (FIG. 10) is greater than the drying rate of portion P1 and P3 of substrate 10 (located at top 10t of substrate 10 and top 12t of opening 12, respectively). Because the speed at which substrate 10 is raised is varied to accommodate differences in the rate at which the different portions of substrate 10 dry, the overall speed of the drying process is improved.

The rate at which bottom 12b of opening 12 and the bottom 10b of substrate 10 dry is also less than the drying rate of portions P2, P4 and P6. Therefore the speed at which substrate 10 is raised as portions P5 and P7 of substrate 10 pass the surface 16t of water 16 is also reduced.

Referring to FIG. 4, after bottom 12b of opening 12 passes top surface 16t of water 16, arms 26a, 26b of a second holder move inwardly (see arrows H and I). The second holder then begins to move upwardly (arrow J in FIG. 5) to lift substrate 10 out of contact with holder 22, and pull substrate 10 out of the bath (FIG. 6). Of importance, arms 26a, 26b of the second holder are never immersed in water 16 during a process in accordance with the invention. Accordingly, it is unnecessary to wait until the second holder dries before it can grab substrate 10. Thus, a drying method in accordance with the present invention is fast and efficient.

In one embodiment, arms 26a, 26b are brought inwardly until they reach a stop point. Upon reaching this stop point, arms 26a, 26b are still not in contact with substrate 10. Arms 26a, 26b do not contact substrate 10 until they move upwardly. However, in other embodiments, arms 26a, 26b can contact substrate 10 as soon as they move inwardly.

Also, in one embodiment, holder 22 is still moving in an upward direction at the time that substrate 10 is handed off to arms 26a, 26b (which are also moving upwardly, but faster than holder 22). In this embodiment, the handoff of substrate 22 to arms 26 is similar to the handoff of a baton in a relay race.

In one embodiment, holder 22 can remain immersed in water 16 while arms 26 continue to lift substrate 10 out of contact with water 16.

Referring to FIG. 7, when substrate 10 is entirely within a dry portion of compartment 24, the second holder halts. At this point, water 16 is dumped from tank 15, e.g. into the bottom of container 14. (This dumping can be accomplished fairly quickly, e.g. between 2 and 5 seconds. The water can be dumped to a location 14b at the bottom of container 14.) The flow of the IPA vapor into compartment 24 then stops, and hot nitrogen is then introduced into compartment 24 via one or more nozzles 29. The nitrogen can have a temperature between about 150 to 300° (e.g. 200° C.) and can be introduced for a time between about 5 and 120 seconds (e.g. 30 seconds). The nitrogen ensures that any residual water is removed from substrate 10. Because water is dumped from container 15, there is no chance of splashing during this part of the process.

In one embodiment, during the entire process, room temperature nitrogen is passed through compartment 24. In other words, this nitrogen is introduced into and vented out of compartment 24 as part of the process gas that facilitates drying. This room temperature nitrogen flow occurs during the entire drying process except a) when the IPA vapor is flowing into compartment 24, or b) when the high temperature nitrogen is flowing into compartment 24.

After the above-mentioned hot nitrogen introduction is complete, cover 20 opens, i.e. by moving in direction K. The second holder then lifts substrate 10 out of apparatus 13 (see FIG. 8). A second shuttle 30 then moves in a direction L to a position under substrate 10 (FIG. 9). The second holder is then lowered (direction M), thereby handing off substrate 10 to shuttle 30, which then carries substrate 10 in direction N to a next station, e.g. a station where substrate 10 can be placed in a cassette.

As mentioned above, the first and second holders are able to move up and down at different speeds. In one embodiment, first holder 22 is coupled to a motor (schematically shown as motor 32 in FIG. 11) that moves holder 22 up and down. This motor can be a DC brushless servo motor or a stepper motor. The motor is controlled by an electronic controller such as a CTC controller (not shown), manufactured by Control Technology, Inc. Similarly, the motor (not shown) that controls the vertical motion of the second holder is also a DC brushless servo motor or a stepper motor controlled by the CTC controller. However, other mechanisms (including other types of motors) can be used to move the first and second holders up and down. These motors can be coupled to the first and second holders by a threaded "lead screw" coupling mechanism. In other words, the first and second holders are mechanically coupled to a threaded lead screw structure that is rotated by the above-mentioned motors to move the first and second holders up and down. FIG. 11 schematically illustrates the manner in which holder 22 can be coupled to the threaded cork-screw drive 40. Drive 40 is rotated by a motor 32. As motor 32 rotates drive 40, a carriage 44, coupled to holder 22, rides up and down on drive 40 to raise and lower holder 20. It should be emphasized that FIG. 11 is merely an exemplary illustration of one manner in which the holders can be moved up and down. The second holder can be similarly mounted on a carriage to be moved up and down.

In one embodiment, arms 26a, 26b of the second holder are moved in and out by a pneumatic device such as an air cylinder. However, other mechanisms can be used to move arms 26a and 26b in and out.

FIG. 10 shows substrate 10 in plan view, and shows a first area P1 at top 10t of substrate 10, a second area P2 between top 10t of substrate 10 and top 12t of opening 12, a third area P3 at the top 12t of opening 12, a fourth area P4 between the top 12t and bottom 12b of opening 12, a fifth area P5 at the bottom 12b of opening 12, a sixth area P6 between the bottom 12b of opening 12 and the bottom 10b of substrate 10, and a seventh area P7 at the bottom 10b of substrate 10. As described above, substrate 10 moves relatively slowly when areas P1, P3, P5 and P7 move past the top 16t of water 16. Substrate 10 moves relatively quickly when areas P2, P4 and P6 move past top 16t of water 16. (Substrate 10 can also move relatively quickly before area P1 reaches top 16t of water 16 and after area P7 passes top 16t of water 16. Substrate 10 can also move relatively quickly while it is being lowered into water 16.) Area P1 can be a distance D between 5 and 10 mm wide centered about top 10t of substrate 10. Similarly, areas P3, P5 and P7 can be a distance D between 5 and 10 mm wide, centered about top 12t, bottom 12b and bottom 10b, respectively. Substrate 10 can be about 95 mm in diameter. However, these dimensions are merely exemplary.

It should also be noted that in some embodiments, the velocity of substrate 10 when area P1 passes top surface 16t of water 16 is not constant, but rather, can vary. Similarly, in some embodiments, the velocity of substrate 10 when areas P2 to P7 pass top surface 16t of water 16 can also vary. Optionally, the upward velocity of substrate 10 when areas P1, P3, P5 and P7 pass top 16t of water 16 can be the same. Also optionally, the velocity of substrate 10 when areas P2, P4 and P6 pass top surface 16t of water 16 can also be the same. In other embodiments, however, they can be different.

While the invention has been described with respect to specific embodiments, those skilled in the art will recognize that changes can be made in form and detail without departing from the spirit and scope of the invention. For example, different types of workpieces can be rinsed and dried in accordance with the invention. The speeds and timing parameters of the workpieces and the various lifting mechanisms, and other parameters such as temperatures or gas and liquid compositions described herein are exemplary, and other parameters can be used. Although the drawings only show one substrate 10 being rinsed and dried, typically, several or many (e.g. fifty) substrates are rinsed and dried simultaneously. The various holders and shuttles extend lengthwise along an axis perpendicular to the plane of the figures as a set of arms. These arms typically include notches for holding numerous substrates.

Apparatus in accordance with the invention can comprise optical or other types of sensors, or encoders, for communicating to a controller the location of various elements of the apparatus. The controller can use this information to control the movement of the various shuttles and holders described herein.

In one embodiment, during the entire time that tank 15 is filled with water 16, an excess amount of water is always slowly introduced into tank 15, and always slowly spills over the top 15t of tank 15. It is believed that if there is any contamination in water 16, it will reside close to top 16t of water 16. Thus, by causing water to constantly overflow tank 15, it is believed that any contamination will constantly be flushed from apparatus 13.

It should also be appreciated that different aspects of the invention described herein can be practiced independently of other aspects of the invention. Accordingly, all such changes come within the present invention.

We claim:

1. A method for drying a workpiece comprising the acts of:
   providing said workpiece in a liquid bath, said workpiece being held with a first holder such that said workpiece is immersed in said bath;
   raising said workpiece so that a first portion of said workpiece extends out of said bath but a second portion of said workpiece remains in said bath;
   causing a second holder to lift said first portion of said workpiece while said second portion is still in said bath, such that the portion of said second holder that lifts said first portion of said workpiece does not come into contact with said liquid during said method;
   raising said workpiece out of contact with said liquid with said second holder after said act of causing; and
   drying said workpiece, at least some of said drying occurring during said acts of raising and said act of causing.

2. Method of claim 1 wherein said providing comprises causing said first holder to lower said workpiece into said liquid, and wherein said first holder is immersed in said liquid after said act of causing said first holder to lower.

3. Method of claim 1 wherein said workpiece is a disk-shaped substrate having an opening therein, said acts of raising comprising:
   raising said substrate at a first rate prior to a time that a top of said substrate extends out of said liquid;
   raising said substrate at a second rate lower than said first rate while a top of said substrate breaks a surface of said liquid;
   raising said substrate at a third rate faster than said second rate after the top of said substrate has broken the surface of said liquid but before a top of said opening breaks the surface of said liquid;
   raising said substrate at a fourth rate slower than said third rate while the top of said opening breaks the surface of said liquid;
   raising said substrate at a fifth rate faster that said fourth rate after the top of said opening has broken the surface of said liquid but before a bottom of said opening breaks the surface of said liquid;
   raising said substrate at a sixth rate slower than said fifth rate while the bottom of said opening breaks the surface of said liquid;
   raising said substrate at a seventh rate faster than said sixth rate after the bottom of said opening has broken the surface of said liquid but before a bottom of said substrate breaks the surface of said liquid; and
   raising said substrate at an eighth rate slower than said seventh rate while the bottom of said substrate breaks the surface of said liquid.

4. Method of claim 1 wherein said workpiece is a substrate.

5. A method for drying a workpiece, said method comprising the acts of:
   providing said workpiece in a liquid;
   raising said workpiece to remove said workpiece from said liquid, wherein the raising of said workpiece is accomplished at different velocities as said workpiece leaves said liquid; and
   causing said workpiece to dry, at least a portion of said act of causing said workpiece to dry being accomplished during said raising,
   wherein said workpiece is raised at a first rate while a top of said workpiece is raised past a surface of said liquid, said workpiece is raised at a second rate during a time period after the top of said workpiece is raised past the surface of said liquid, and said workpiece is raised at a third rate while a bottom of said workpiece is raised past the surface of said liquid, said first and third rates being slower than said second rate.

6. Method of claim 5 wherein said workpiece has a centrally located opening, said workpiece being raised at a fourth rate while a top of said centrally located opening passes the surface of said liquid, said workpiece being raised at a fifth rate during a time period after the top of said opening has passed the surface of said liquid but before a bottom of said opening has passed the surface of said liquid, said workpiece being raised at a sixth rate while the bottom of said opening passes the surface of said liquid, said fourth and sixth rates being slower than said fifth rate.

7. Method of claim 5 wherein a speed at which said workpiece is raised is slower while a slow-drying portion of said workpiece is being pushed past the surface of said liquid than while a fast-drying portion of said workpiece is being pushed past the surface of said liquid.

8. Method of claim 7 wherein said workpiece is a substrate having a centrally located opening and wherein a top and bottom of the substrate and a top and bottom of the centrally located opening comprise slow-drying portions of the substrate, and other portions of the substrate are fast-drying.

9. Method of claim 5 wherein said workpiece is disk-shaped.

10. A method for drying a workpiece comprising the acts of:
   providing said workpiece in a liquid bath, said workpiece being held with a first holder such that said workpiece is immersed in said bath;
   causing relative motion between said workpiece and a top surface of liquid within said bath so that a first portion of said workpiece extends out of said bath but a second portion of said workpiece remains in said bath while said workpiece is being held by said first holder;
   causing a second holder to hold said first portion of said workpiece and said first holder to relinquish holding said workpiece while said second portion of said workpiece is still in said bath, such that the portion of said second holder that holds said first portion of said workpiece does not come into contact with said liquid during said method;

causing relative motion between said workpiece and said surface of said liquid so as to take said workpiece out of contact with said liquid while said second holder holds said workpiece; and drying said workpiece, at least some of said drying occurring during said acts of causing.

11. Method of claim 10 wherein said workpiece is a substrate.

12. A method for drying a workpiece, said method comprising the acts of:

providing said workpiece in a liquid;

causing relative motion between said workpiece and a top surface of said liquid so as to take said workpiece out of contact with said liquid, wherein the relative motion of said workpiece with respect to the top surface of said liquid is accomplished at different velocities as said workpiece is taken out of contact with said liquid; and drying said workpiece, at least some of said drying occurring during said act of causing, wherein said relative motion is at a first velocity while a top of said workpiece breaks the surface of said liquid, said relative motion is at a second velocity during a time period after the top of said workpiece breaks the surface of said liquid, and said relative motion is at a third velocity while a bottom of said workpiece breaks the surface of said liquid, said first and third velocities being slower than said second velocity.

13. Method of claim 12 wherein said workpiece has a centrally located opening, said relative motion being at a fourth velocity while a top of said centrally located opening passes the surface of said liquid, said relative motion being at a fifth velocity after the top of said opening has passed the surface of said liquid but before a bottom of said opening has passed the surface of said liquid, said relative motion being at a sixth velocity while the bottom of said opening passes the surface of said liquid, said fourth and sixth velocities being slower than the fifth velocity.

* * * * *